United States Patent
Chen et al.

(10) Patent No.: US 10,284,927 B2
(45) Date of Patent: May 7, 2019

(54) COMMISSIONING LOAD DEVICES VIA CHALLENGE-RESPONSE-TIMING

(71) Applicant: SIGNIFY HOLDING B.V., Eindhoven (NL)

(72) Inventors: Hongxin Chen, Shanghai (CN); Hong Chen, Shanghai (CN)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/768,124

(22) PCT Filed: Sep. 23, 2016

(86) PCT No.: PCT/EP2016/072644
§ 371 (c)(1),
(2) Date: Apr. 13, 2018

(87) PCT Pub. No.: WO2017/063846
PCT Pub. Date: Apr. 20, 2017

(65) Prior Publication Data
US 2018/0310077 A1   Oct. 25, 2018

(30) Foreign Application Priority Data

Oct. 16, 2015  (WO) ................ PCT/CN2015/092089

(51) Int. Cl.
*H04Q 9/00* (2006.01)
*G01R 19/25* (2006.01)
*H04L 12/24* (2006.01)
(Continued)

(52) U.S. Cl.
CPC ............. *H04Q 9/00* (2013.01); *H04L 12/403* (2013.01); *H04L 41/0806* (2013.01);
(Continued)

(58) Field of Classification Search
CPC ............. G06K 7/0008; G06K 19/0723; G06K 7/10297; G06K 7/10009; G06K 7/10356;
(Continued)

(56) References Cited

U.S. PATENT DOCUMENTS 5,319,311 A    6/1994  Kawashima et al.
6,532,215 B1   3/2003  Muntz
(Continued)

FOREIGN PATENT DOCUMENTS

| CA | 2496322 A1    | 3/2004 |
| EP | 1198094 B1    | 4/2002 |
| WO | 2015000754 A1 | 1/2015 |
| WO | 2015071232 A2 | 5/2015 |

Primary Examiner — Mark S Blouin

(57) ABSTRACT

Commission devices (1) comprise first transmitters (11) for transmitting activation signals to load devices (2-6), and second transmitters (12) for transmitting numbers of challenge signals to activated load devices (2) that respond by sending back a response signal per challenge signal to the commission devices (1). The commission devices (1) further comprise first receivers (13) for receiving the response signals and controllers (14) for determining time-intervals present between transmissions of the challenge signals and receptions of the response signals. The controllers (14) derive absolute or relative positions of the load devices (2-6) from analyzes such as statistical analyzes of the time-intervals. Load devices (2-6) comprise second receivers (21) for receiving the activation signals and third receivers (22) for receiving the number of challenge signals and third transmitters (23) for sending back the response signals to the commission devices (1). The load devices (2-6) may further comprise loads (26).

15 Claims, 5 Drawing Sheets

(51) Int. Cl.
  *H04L 12/26*     (2006.01)
  *H04L 12/28*     (2006.01)
  *H05B 37/02*     (2006.01)
  *H04L 12/403*    (2006.01)

(52) U.S. Cl.
  CPC ........ *H04L 41/142* (2013.01); *H04L 43/0864* (2013.01); *H05B 37/0254* (2013.01); *G01R 19/2513* (2013.01); *H04L 12/2803* (2013.01); *H04Q 2213/13172* (2013.01); *H04Q 2213/16* (2013.01)

(58) Field of Classification Search
  CPC ........... G06K 7/10039; G06K 7/10128; G06K 7/10198
  USPC .......................................................... 340/10.3
  See application file for complete search history.

(56) References Cited

U.S. PATENT DOCUMENTS

| | | | |
|---|---|---|---|
| 6,700,877 B1* | 3/2004 | Lorenz | H04L 12/403 370/254 |
| 8,487,474 B2* | 7/2013 | Weidman | H02J 3/14 307/38 |
| 8,867,657 B1 | 10/2014 | Flake | |
| 9,461,471 B2* | 10/2016 | Forbes, Jr. | G05B 15/02 |
| 10,098,074 B2* | 10/2018 | Baker | H04W 76/14 |
| 2012/0165959 A1 | 6/2012 | Van Der Stok et al. | |
| 2013/0185006 A1 | 7/2013 | Schwager et al. | |
| 2018/0027630 A1* | 1/2018 | DeJonge | H05B 33/0815 315/86 |
| 2018/0310077 A1* | 10/2018 | Chen | H04L 43/0864 |

* cited by examiner

A

B

C

D

E

COMMISSIONING LOAD DEVICES VIA CHALLENGE-RESPONSE-TIMING

CROSS-REFERENCE TO PRIOR APPLICATIONS

This application is the U.S. National Phase application under 35 U.S.C. § 371 of International Application No. PCT/EP2016/072644, filed on Sep. 23, 2016 which claims the benefit of Chinese Patent Application No. PCT/CN2015/092089, filed on Oct. 16, 2015. These applications are hereby incorporated by reference herein.

FIELD OF THE INVENTION

The invention relates to a commission device configured to commission load devices. The invention further relates to a control device comprising the commission device, to a load device, to a system and to a method. Examples of such a load device are drivers for driving light units, interfaces for interfacing light units, and light units.

BACKGROUND OF THE INVENTION

U.S. Pat. No. 6,532,215 B1 discloses a device and method for network communications and diagnostics. The device and method use reflection signals that result from impedance mismatching.

SUMMARY OF THE INVENTION

It is an object of the invention to provide an improved commission device. It is a further object of the invention to provide a control device, a load device, a system and an improved method.

According to a first aspect, a commission device is provided configured to commission load devices, which commission device comprises

- a first transmitter configured to transmit an activation signal to a load device for activating this load device,
- a second transmitter configured to transmit a number of challenge signals to the activated load device, which activated load device is configured to respond to the number of challenge signals by sending back a response signal per challenge signal to the commission device,
- a first receiver configured to receive the response signals from the activated load device, and
- a controller configured to determine time-intervals present between transmissions of the challenge signals and receptions of the response signals, which controller is further configured to derive a position of the load device from an analysis of the time-intervals.

The commission device comprises a first transmitter configured to transmit an activation signal to a load device for activating this load device. Such an activation signal for example comprises an address for addressing one particular load device, without having excluded other kinds of signals. The commission device comprises a second transmitter configured to transmit a number of challenge signals to the activated load device. The activated load device is configured to respond to the number of challenge signals by sending back a response signal per challenge signal to the commission device. Such challenge signals and such response signals for example comprise square waves or voltage jumps, without having excluded other kinds of signals.

The commission device further comprises a first receiver configured to receive the response signals from the activated load device, and a controller for controlling the commission device. This controller is configured to determine time-intervals present between transmissions of the challenge signals on the one hand and receptions of the response signals on the other hand. Between a transmission of a first (second etc.) challenge signal and a reception of a first (second etc.) response signal, a first (second etc.) time-interval is present. The controller is further configured to derive a position of the load device from an analysis of the time-intervals.

The speed of signals through air is about 30 cm/nsec, and the speed of signals through copper is about 20 cm/nsec. The controller that controls the commission device usually operates with a clock signal having a relatively high clock speed, but a controller that controls the load device usually operates with a clock signal having a relatively low clock speed. As a result, an amount of delay introduced inside the load device may be significant compared to the travelling time of the challenge signal and the traveling time of the response signal. Further, this delay may show relatively large fluctuations. The commission device can measure the time-interval relatively precisely, but the load device may react to a reception of a challenge signal by sending a response signal relatively immediately, or relatively lately, depending on the fact whether the edges or levels of both clock signals of both devices in each case match, or not, respectively. So, one time-interval will not give much information about a position of a load device.

By deriving a position of a load device from an analysis of a number of time-intervals, the position of the load device can be determined much better. This is a great technical advantage. The number of challenge signals and time-intervals comprises at least two challenge signals and time-intervals, preferably at least ten challenge signals and time-intervals, more preferably at least one hundred challenge signals and time-intervals etc. A time-interval can be expressed in time or in numbers of clock pulses or in any other way.

The first and second transmitters may be different transmitters that use the same coupling or different couplings to the load device, and may be the same transmitter that uses the same coupling to the load device. The first receiver will usually use the coupling to the load device that is also used by the second transmitter.

An embodiment of the commissioning device is defined, wherein the response signals are different from reflection signals that result from impedance mismatching. A determination of a position of a load device at the hand of the travelling time of a challenge signal and the travelling time of a returning reflection signal resulting from impedance mismatching is common in the art.

An embodiment of the commissioning device is defined, wherein the analysis comprises a statistical analysis. Preferably, a statistical analysis is performed to derive the position of the load device from the time-intervals.

An embodiment of the commissioning device is defined, wherein the statistical analysis comprises a calculation of a mean value or any other value of the time-intervals or functions thereof or comprises an analysis of a distribution or any other spread of the time-intervals or functions thereof or comprises a determination of a minimum value of the time-intervals or functions thereof, for one load device or for several load devices. According to a first option, the statistical analysis comprises a calculation of a mean value or any other value of the time-intervals. The calculation of any other value of the time-intervals may for example comprise a calculation of differences between the time-intervals to get rid of constant parameters that do not fluctuate. According to a second option, the statistical analysis comprises an analysis of a distribution or any other spread of the time-intervals. According to a third option, the statistical analysis comprises a determination of a minimum value of the time-intervals. Per option, the results for a load device may (need to) be compared with the results of other load devices, or not. Functions of the time-intervals may for example comprise numbers of clock pulses of the clock signal of the commission device present within the time-intervals or any other values derived from the time-intervals. Said three options and parts thereof may be combined.

An embodiment of the commissioning device is defined, wherein the position of the load device comprises an absolute position or a relative position. An absolute position may be a position defined by numbers of length units, and a relative position may be a position defined in relation to other positions of other load devices.

An embodiment of the commissioning device is defined, wherein the activation signal comprises a prepare-for-commissioning signal and wherein the activated load device comprises a load device that has been prepared for commissioning. Preferably, an activation of the load device comprise a preparation for commissioning. The preparation for commissioning is a specific example of the general activation.

An embodiment of the commissioning device is defined, wherein the second transmitter is configured to transmit the number of challenge signals periodically or randomly. The second transmitter may transmit the number of challenge signals periodically at fixed moments in time or randomly at random moments in time.

An embodiment of the commissioning device is defined, wherein the commission device is configured to commission the load devices via a communication bus. Preferably, the commission device is coupled to the load devices via a communication bus. Such a communication bus forms a for example shielded coupling between the commission device and the load devices that has relatively fixed properties compared to an air coupling. Further, such a communication bus may in addition allow a feeding signal to be supplied to the load devices as well.

An embodiment of the commissioning device is defined, wherein the first and second transmitters and the first receiver are configured to be coupled to the communication bus. Again, the first and second transmitters may be different transmitters using different parts (frequencies, wave lengths, time slots) of the communication bus or may be the same transmitter. The first and second transmitters and the first receiver may be coupled to the communication bus indirectly via for example a bus-interface or directly without the bus-interface being in between.

According to a second aspect, a control device is provided comprising the commission device as defined above, wherein the control device is configured to control the load devices. The control device controls the load devices by switching the load devices on and off and by adapting their settings etc.

According to a third aspect, a load device is provided configured to be commissioned by the commission device as defined above, wherein the load device comprises a second receiver configured to receive the activation signal from the commission device for activating this load device, a third receiver configured to receive the number of challenge signals from the commission device, and a third transmitter configured to send back, in response to receptions of the number of challenge signals, the response signal per challenge signal to the commission device.

An embodiment of the load device is defined, wherein the load device further comprises a load. So, in a minimum situation, a load device is defined to be a device that can be coupled to a load. In an extended situation, the load device further comprises the load, such as a light dot or a lamp or any other kind of load.

According to a fourth aspect, a system is provided comprising the load device as defined above, wherein the system further comprises at least one of the commission device as defined above and the control device as defined above.

An embodiment of the system is defined, wherein the system further comprises a communication bus coupled to the load device and to said at least one of the commission device as defined above and the control device as defined above.

According to a fifth aspect, a method is provided for commissioning load devices, which method comprises the steps of transmitting an activation signal to a load device for activating this load device, transmitting a number of challenge signals to the activated load device, which activated load device is configured to respond to the number of challenge signals by sending back a response signal per challenge signal, receiving the response signals from the activated load device, and determining time-intervals present between transmissions of the challenge signals and receptions of the response signals, and deriving a position of the load device from an analysis of the time-intervals.

A basic idea is that a commissioning device should derive a position of a load device from an analysis of time-intervals present between transmissions of challenge signals and receptions of response signals.

A problem to provide an improved commissioning device has been solved. A further advantage is that disadvantages of prior art reflection technologies are avoided.

These and other aspects of the invention will be apparent from and elucidated with reference to the embodiments described hereinafter.

DETAILED DESCRIPTION OF EMBODIMENTS

Figure 1:
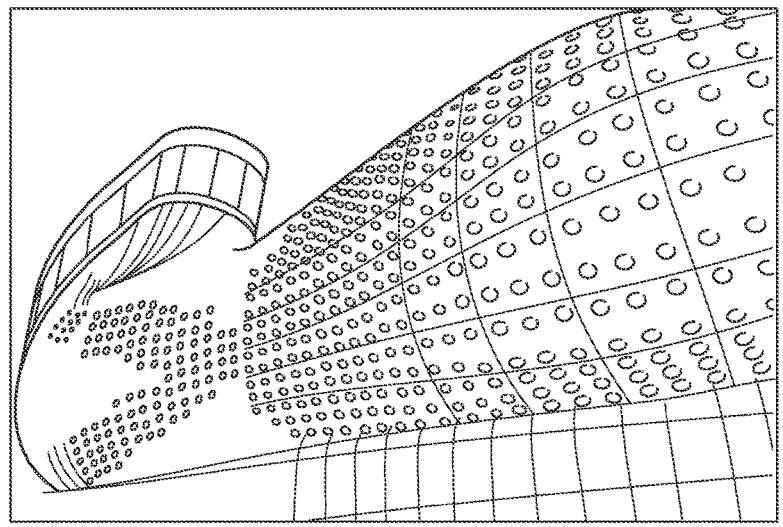
FIG. 1 shows an embodiment of a group of loads.

In the FIG. 1, an embodiment of a group of loads is shown. Each load comprises a light dot or a lamp.

Figure 2:
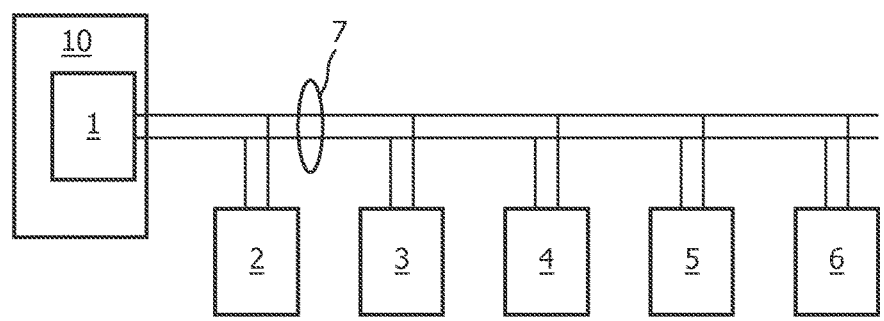
FIG. 2 shows an embodiment of a system.

In the FIG. 2, an embodiment of a system is shown. The system comprises a control device 10 that comprises a commission device 1. Both devices 1, 10 are coupled to a communication bus 7 that is further coupled to load devices 2-6. Each load device 2-6 may comprise a load as shown in the FIG. 1. The control device 10 is configured to control the load devices 2-6, and the commission device 1 is configured to commission the load devices 2-6.

Figure 3:
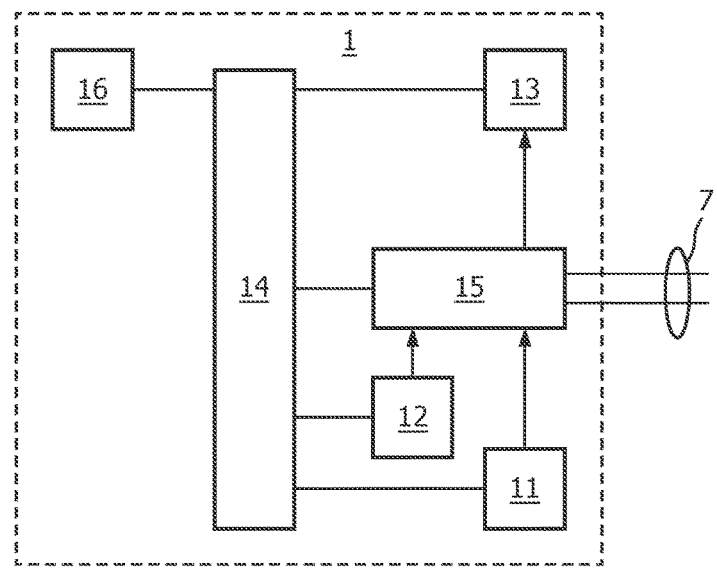
FIG. 3 shows an embodiment of a commission device.

In the FIG. 3, an embodiment of a commission device is shown. The commission device 1 comprises a first transmitter 11 configured to transmit an activation signal to a load device 2 for activating this load device 2. The commission device 1 further comprises a second transmitter 12 configured to transmit a number of challenge signals to the activated load device 2. Such an activated load device 2 is configured to respond to the number of challenge signals by sending back a response signal per challenge signal to the commission device 1. The commission device 1 further comprises a first receiver 13 configured to receive the response signals from the activated load device 2. The commission device 1 further comprises a controller 14 configured to determine time-intervals present between transmissions of the challenge signals on the one hand and receptions of the response signals on the other hand. The controller 14 is further configured to derive a position of the load device 2 from an analysis of the time-intervals.

These response signals are not to be confused with reflection signals that result from impedance mismatching. The activation signal may for example comprise an address for addressing the load device 2. An example of such an activation signal may be a prepare-for-commissioning signal, in which case the activated load device 2 may comprise a load device that has been prepared for commissioning.

Usually, the analysis comprises a statistical analysis, such as for example a calculation of a mean value or any other value of the time-intervals or functions thereof or such as for example an analysis of a distribution or any other spread of the time-intervals or functions thereof or such as for example a determination of a minimum value of the time-intervals or functions thereof, for one load device 2 or for several load devices 2-6.

The position of the load device 2 may be an absolute position or a relative position. The second transmitter 12 is configured to transmit the number of challenge signals periodically or randomly.

In the FIGS. 2 and 3, the commission device 1 is configured to commission the load devices 2-6 via the communication bus 7, but alternatively the commissioning may be done via another communication medium. In the FIG. 3, the first and second transmitters 11 and 12 and the first receiver 13 are coupled to a bus-interface 15, that is further coupled to the communication bus 7, but alternatively the bus-interface 15 could be left out or integrated into said first and second transmitters 11 and 12 and said first receiver 13. A controller 14 controls and/or communicates with the first and second transmitters 11 and 12 and the first receiver 13 and the bus-interface 15, and further controls and/or communicates with a man-machine-interface 16. An example of such a controller 14 is a processor/memory combination that is operated with a clock signal having a relatively high clock speed, like for example 10 MHz or 100 MHz etc.

Figure 4:
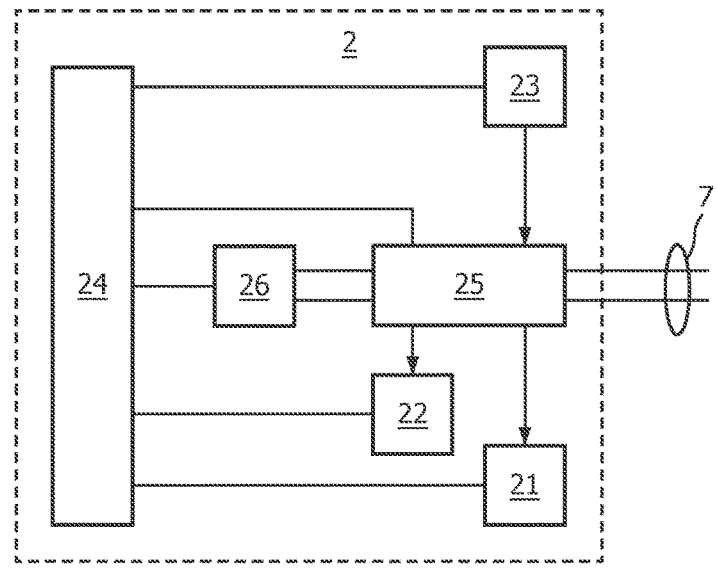
FIG. 4 shows an embodiment of a load device.

In the FIG. 4, an embodiment of a load device is shown. The load device 2 is configured to be commissioned by the commission device 1 as shown in the FIG. 3 and comprises a second receiver 21 configured to receive the activation signal from the commission device 1 for activating this load device 2. The load device 2 further comprises a third receiver 22 configured to receive the number of challenge signals from the commission device 1. The load device 2 further comprises a third transmitter 23 configured to send back, in response to receptions of the number of challenge signals, the response signal per challenge signal to the commission device 1. The load device 2 may further comprises a load 26 such as for example a light dot or a lamp.

In the FIGS. 2 and 4, the load device 2 is configured to be commissioned by the commission device 1 via the communication bus 7, but alternatively the commissioning may be done via another communication medium. In the FIG. 4, the second and third receivers 21 and 22 and the third transmitter 23 and the load 26 are coupled to a bus-interface 25, that is further coupled to the communication bus 7, but alternatively the bus-interface 15 could be left out or integrated into said second and third receivers 21 and 22 and said third transmitter 23 and said load 26. A controller 24 controls and/or communicates with the second and third receivers 21 and 22 and the third transmitter 23 and the bus-interface 25 and the load 26. An example of such a controller 24 is a processor/memory combination that is operated with a clock signal having a relatively low clock speed, like for example 1 MHz or 10 MHz etc. Usually, the relatively high clock speed of the clock signal of the controller 14 is higher than the relatively low clock speed of the clock signal of the controller 24.

Figure 5:
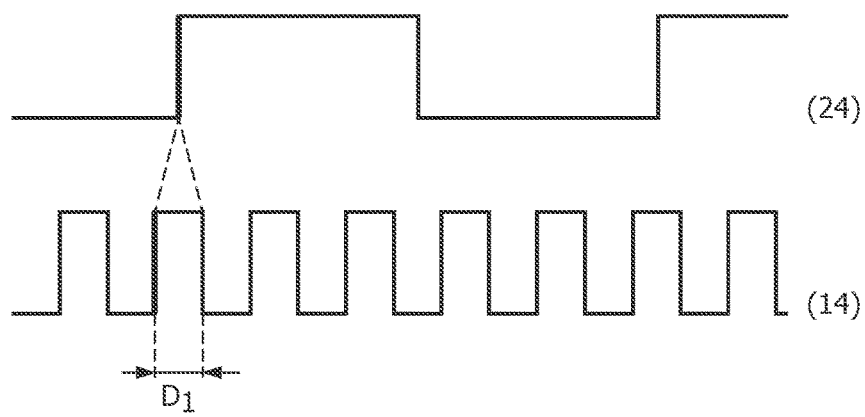
FIG. 5 shows clock signals in a first situation.

In the FIG. 5, clock signals are shown in a first situation. In this first situation, a rising edge of the clock signal having the relatively high clock speed of the controller 14 is situated in time just sufficiently before a rising edge of the clock signal having the relatively low clock speed of the controller 24. As a result, the load device 2 can react immediately to the challenge signal from the commission device 1 by sending back the response signal to the commission device 1. A minimum value of a total delay D1 (read: a duration of a time-interval present between a transmission of the challenge signal and a reception of the response signal) will be equal to a sum of a travelling time of the challenge signal and a travelling time of the response signal.

Figure 6:
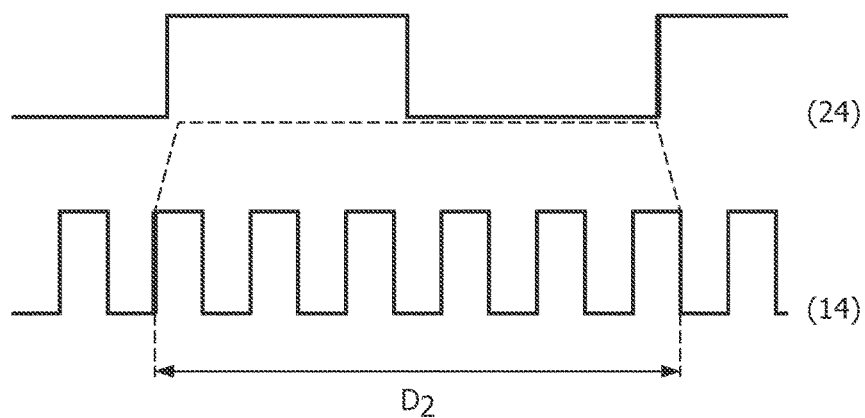
FIG. 6 shows clock signals in a second situation.

In the FIG. 6, clock signals are shown in a second situation. In this second situation, a rising edge of the clock signal having the relatively high clock speed of the controller 14 is situated in time insufficiently before a rising edge of the clock signal having the relatively low clock speed of the controller 24. As a result, the load device 2 can only react later to the challenge signal from the commission device 1 by sending back the response signal to the commission device 1 shortly after the next rising edge of the clock signal having the relatively low clock speed of the controller 24. A maximum value of a total delay D2 (read: a duration of a time-interval present between a transmission of the challenge signal and a reception of the response signal) will be equal to a sum of a travelling time of the challenge signal and a travelling time of the response signal and a period of the clock signal having the relatively low clock speed of the controller 24.

So, one time-interval will not give much information about a position of a load device 2-6. But by deriving a position of a load device 2-6 from an analysis of a number of time-intervals, the position of the load device 2-6 can be determined much better. The number of challenge signals and time-intervals comprises at least two challenge signals and time-intervals, preferably at least ten challenge signals and time-intervals, more preferably at least one hundred challenge signals and time-intervals etc. For a sufficient number of challenge signals and time-intervals, a total delay will satisfy an even distribution.

Figure 7:
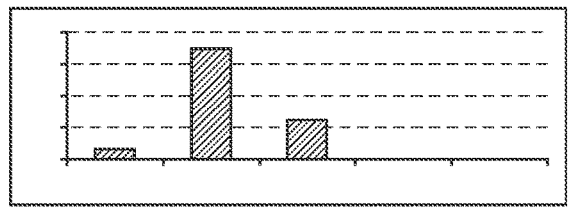
FIG. 7 shows distributions of time-intervals.
Figure 7:
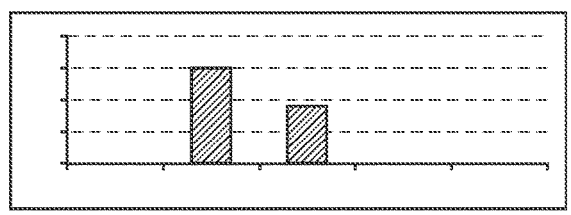
Figure 7:
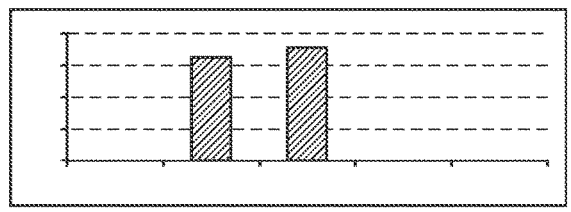
Figure 7:
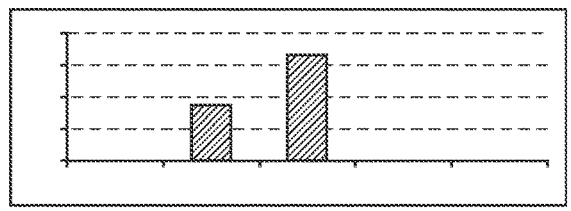
Figure 7:
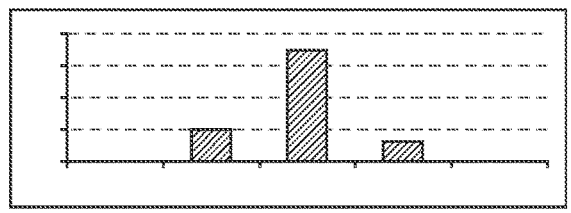

In the FIG. 7, distributions of time-intervals are shown. FIGS. 7A, 7B, 7C, 7D and 7E show distributions of time-intervals for load devices 2-6 at 1 meter, 2 meter, 3 meter, 4 meter and 5 meter distance from the commission device 1 respectively. Clearly, from FIG. 7A to FIG. 7E, the distributions are going to the right. Calculations made at the hand of these distributions resulted in having found absolute positions of the load devices 2-6 at an accuracy of about 10 cm.

For the time-intervals related to the FIG. 7A, a calculation of a mean value of the time-intervals will result in a smaller value than a similar calculation for the time-intervals related to the FIG. 7B etc. For the time-intervals related to the FIG. 7A, a determination of a minimum value of the time-intervals will result in a smaller value than a similar calculation for the time-intervals related to the FIG. 7B etc. So, alternatively to the distribution or any other spread of the time-intervals, another statistical analysis is possible too.

As an example only, in case a sum of a travelling time of the challenge signal and a travelling time of the response signal is equal to t+t=2t and in case a total delay between a transmission of the challenge signal and a reception of the response signal is D and in case a clock period of the controller 14 of the commission device is $T_C$ and in case a period of a clock period or the controller 24 of the load device is $T_L$, it can be defined that: $N=D/T_C$. Then, $N_{min}=2t/T_C$ whereby N and $N_{min}$ are rounded up integers, and they are time intervals measured by the controller 14 with respect to D as numbers of clock periods. D is evenly distributed in a range from 2t to $T_L+2t$, and when D is in the range [2t, $N_{min} T_C$], the relevant N is equal to $N_{mm}$, and a probability of $N_{min}$ can be derived:

$$P\{N_{min}\}=(N_{min}T_C-2t)/(T_L+2t-2t)=(N_{min}T_C-2t)/T_L.$$

From this equation, t can be derived:

$$t=0.5(N_{min}T_C-P\{N_{min}\}T_L).$$

In case N is determined K times, and in k out of K times $N_{min}$ is found, then $P\{N_{min}\}\approx k/K$.
Then, $t\approx 0.5 (N_{min} T_C - k T_L/K)$.

In case the controller 24 introduces a delay $T_D$ for example owing to the fact that it needs several clock periods to detect the challenge signal and to instruct the response signal to be sent back, or in case the controller 14 introduces a delay $T_D$ for example owing to the fact that it needs several clock periods to prepare the challenge signal and/or that it needs several clock periods to detect the response signal and/or that it needs several clock periods to determine the time-intervals, or in case the controllers 24 and 14 together introduce a delay $T_D$ owing to one or more of the reasons discussed before,
then $t\approx 0.5 (N_{min} T_C - kT_L/K - T_D)$.
For a load device i, $t_i \approx 0.5 (N_{min,i} T_C - T_L/K - T_D)$. $t_i$ can be calculated in case $T_D$ is known, and for a given speed in the communication medium, the distance between the load device i and the commission device can be calculated: S $t_i$ wherein S is the speed in the communication medium.
For a load device j, $t_j \approx 0.5 (N_{min,j} T_C - T_L/K - T_D)$.
Then $t_i - t_j$ can be calculated, with the result being independent from $T_D$:
$t_i - t_j \approx 0.5 [(N_{min,i}-N_{min,j})T_C - (k_j-k_i) T_L/K)]$. For a given speed in the communication medium, the distance between the load devices i and j can be calculated: S $(t_i - t_j)$ wherein S is the speed in the communication medium.

As another example only, in case the order of the load devices 2-6 is to be determined, the values for t can be sorted for the different load devices 2-6, or a mean value of N can be calculated, and the values for N can be sorted for the different load devices 2-6 etc. But many other examples of statistical analyses will be possible too and are not to be excluded.

Figure 8:
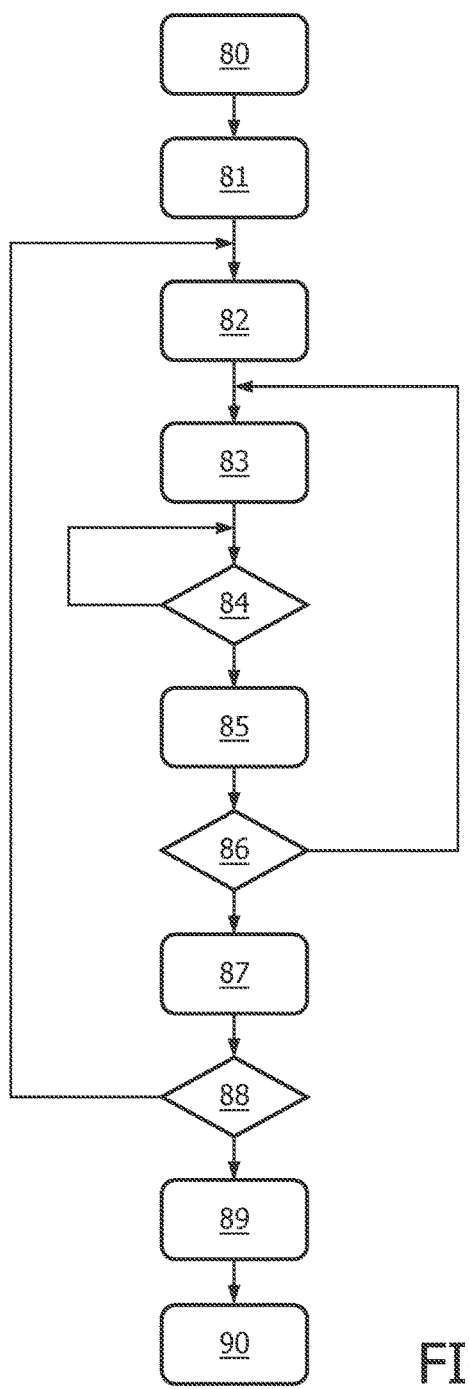
FIG. 8 shows a flow chart.

In the FIG. 8, a flow chart is shown, wherein the following blocks have the following meaning:
Block 80: Start. Go to block 81.
Block 81: Define i=1. Go to block 82.
Block 82: Commission device 1 sends an activation signal with an address i to a load device having an address i. Define k=0. Go to block 83.
Block 83: Commission device 1 sends a challenge signal such as a square wave. Define N=0. Start time counting. Go to block 84.
Block 84: Has the response signal been received? If yes, go to block 85, if no, go to block 84.
Block 85: Stop time counting. N=count. Define k=k+1. Go to block 86.
Block 86: Is k=K? If yes, go to block 87, if no, go to block 83.
Block 87: Commission device 1 sends a de-activation signal with the address i to the load device having the address i. Or, the commission device 1 waits until the activation signal has stopped functioning for said load device. Define i=i+1. Go to block 88.
Block 88: Is i=M? If yes, go to block 89, if no, go to block 82.
Block 89: Commission device 1 performs a statistical analysis on the time-intervals to derive absolute or relative positions of the load devices. Go to block 90.
Block 90: Stop.

Usually, only one load device is activated at a time, for being commissioned. Thereto, via an activation signal, said load device can be activated for a predefined amount of time that is sufficient for commissioning this load device. Alternatively, via an activation signal, said load device can be activated and, when the commissioning has been done, via a de-activation signal, said load device can be de-activated. Possibly, one load device may comprise more than one load. First and second elements can be coupled directly without a third element being in between, and can be coupled indirectly via the third element. The system does, compared to a prior art system, not require the load devices to be synchronized during commissioning and does not require one load device to produce a detection signal having an amplitude that increases as a function of time, which detection signal is to be detected by the other load devices.

Summarizing, commission devices 1 comprise first transmitters 11 for transmitting activation signals to load devices 2-6, and second transmitters 12 for transmitting numbers of challenge signals to activated load devices 2 that respond by sending back a response signal per challenge signal to the commission devices 1. The commission devices 1 further comprise first receivers 13 for receiving the response signals and controllers 14 for determining time-intervals present between transmissions of the challenge signals and receptions of the response signals. The controllers 14 derive absolute or relative positions of the load devices 2-6 from analyses such as statistical analyses of the time-intervals. Load devices 2-6 comprise second receivers 21 for receiving the activation signals and third receivers 22 for receiving the number of challenge signals and third transmitters 23 for sending back the response signals to the commission devices 1. The load devices 2-6 may further comprise loads 26.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A commission device configured to commission load devices, which commission device comprises
    a first transmitter configured to transmit an activation signal to a load device for activating this load device,
    a second transmitter configured to transmit a number of challenge signals to the activated load device, which activated load device is configured to respond to the number of challenge signals by sending back a response signal per challenge signal to the commission device,
    a first receiver configured to receive the response signals from the activated load device, and
    a controller configured to determine time-intervals present between transmissions of the challenge signals and receptions of the response signals, which controller is further configured to derive a position of the load device from an analysis of the time-intervals.

2. The commission device as defined in claim 1, wherein the response signals are actively sent by the activated load device and are different from reflection signals that result from the challenge signals due to impedance mismatching.

3. The commission device as defined in claim 1, wherein the analysis comprises a statistical analysis.

4. The commission device as defined in claim 3, wherein the statistical analysis comprises a calculation of a mean value or any other value of the time-intervals or functions thereof or comprises an analysis of a distribution or any other spread of the time-intervals or functions thereof or comprises a determination of a minimum value of the time-intervals or functions thereof, for one load device or for several load devices, and/or
    the controller is configured to determine the time-intervals by counting a number of internal clock cycles between the transmission of the challenge signals and the reception of the response signals.

5. The commission device as defined in claim 1, wherein the position of the load device comprises an absolute position or a relative position.

6. The commission device as defined in claim 1, wherein the activation signal comprises a prepare-for-commissioning signal and wherein the activated load device comprises a load device that has been prepared for commissioning.

7. The commission device as defined in claim 1, wherein the second transmitter is configured to transmit the number of challenge signals periodically or randomly.

8. The commission device as defined in claim 1, wherein the commission device is configured to commission the load devices via a communication bus.

9. The commission device as defined in claim 8, wherein the first and second transmitters and the first receiver are configured to be coupled to the communication bus.

10. A control device comprising the commission device as defined in claim 1, wherein the control device is configured to control the load devices.

11. A load device configured to be commissioned by the commission device as defined in claim 1, wherein the load device comprises
    a second receiver configured to receive the activation signal from the commission device for activating this load device,
    a third receiver configured to receive the number of challenge signals from the commission device, and
    a third transmitter configured to send back, in response to receptions of the number of challenge signals, the response signal per challenge signal to the commission device.

12. The load device as defined in claim 11, wherein the load device further comprises a load.

13. A system comprising the load device as defined in claim 11, wherein the system further comprises at least one of the commission device and the control device.

14. The system as defined in claim 13, wherein the system further comprises a communication bus coupled to the load device and to said at least one of the commission device and the control device.

15. A method for commissioning load devices, which method comprises the steps of
    transmitting an activation signal to a load device for activating this load device,
    transmitting a number of challenge signals to the activated load device, which activated load device is configured to respond to the number of challenge signals by sending back a response signal per challenge signal,
    receiving the response signals from the activated load device, and
    determining time-intervals present between transmissions of the challenge signals and receptions of the response signals, and deriving a position of the load device from an analysis of the time-intervals.

* * * * *